United States Patent [19]

Maniar et al.

[11] Patent Number: 5,702,981
[45] Date of Patent: Dec. 30, 1997

[54] METHOD FOR FORMING A VIA IN A SEMICONDUCTOR DEVICE

[76] Inventors: Papu D. Maniar, 12618 Olympiad Dr., Austin, Tex. 78759; Roc Blumenthal, 6103 Colina La., Austin, Tex. 78759; Jeffrey L. Klein, 7511 Step Down Cove, Austin, Tex. 78731; Wei Wu, 7701 Yaupon Dr., Austin, Tex. 78729

[21] Appl. No.: 536,537

[22] Filed: Sep. 29, 1995

[51] Int. Cl.⁶ ............................................. H01L 21/44
[52] U.S. Cl. ...................... 437/192; 437/195; 437/194; 437/235; 156/653.1
[58] Field of Search ..................... 437/195, 192, 437/194, 228, 235; 156/653.1

[56] References Cited

U.S. PATENT DOCUMENTS

| 4,641,420 | 2/1987 | Lee | 29/511 |
|---|---|---|---|
| 4,943,539 | 7/1990 | Wilson et al. | 437/195 |
| 4,966,870 | 10/1990 | Barber et al. | 437/228 |
| 5,219,793 | 6/1993 | Cooper et al. | 437/195 |
| 5,268,330 | 12/1993 | Givens et al. | 437/195 |
| 5,286,674 | 2/1994 | Roth et al. | 437/190 |
| 5,294,294 | 3/1994 | Namose | 156/643 |
| 5,451,543 | 9/1995 | Woo et al. | 437/195 |
| 5,525,542 | 6/1996 | Maniar et al. | 437/186 |

FOREIGN PATENT DOCUMENTS

| 0 326 293 | 8/1989 | European Pat. Off. | H01L 21/90 |
|---|---|---|---|
| 0523856 | 1/1993 | European Pat. Off. | |
| 56-33899 | 4/1981 | Japan | H05K 3/46 |
| 58-184741 | 10/1983 | Japan | H01L 21/88 |
| 59-161048 | 9/1984 | Japan | H01L 21/88 |
| 59-169151 | 9/1984 | Japan | H01L 21/88 |
| 59-200439 | 11/1984 | Japan | H01L 21/88 |
| 60-39849 | 3/1985 | Japan | H01L 21/88 |
| 62-145817 | 6/1987 | Japan | H01L 21/302 |
| 4-15923 | 1/1992 | Japan | H01L 21/88 |

OTHER PUBLICATIONS

J. Givens, et al.; "Selective dry etching in a high density plasma for 0.5 . . .; " J. Vac. Sci. Technol. B vol. 12, No. 1, pp. 427–432 (Jan./Feb. 1994).

Primary Examiner—John Niebling
Assistant Examiner—C. Everhart
Attorney, Agent, or Firm—Patricia S. Goddard

[57] ABSTRACT

A method for forming vias in a semiconductor device improves the resistance and reliability of contacts formed by use of an etch stop layer during the via formation process. An etch stop layer (40), preferably a silicon nitride or aluminum nitride layer, is deposited over conductive interconnect (34). A via (44) is etched in interlayer dielectric (42), stopping on etch stop layer (40). Etch stop layer (40) is then anisotropicly etched to expose the top of conductive interconnect (34), while maintaining a portion of the etch stop layer along a sidewall of the interconnect, and particularly along those sidewall portions which contain aluminum. A conductive plug (54) is then formed in the via, preferably using one or more barrier or glue layers (50). Formation of a tungsten plug using tungsten hexafluoride can then be performed without unwanted reactions between the tungsten source gas and the aluminum interconnect.

20 Claims, 3 Drawing Sheets

METHOD FOR FORMING A VIA IN A SEMICONDUCTOR DEVICE

CROSS-REFERENCE TO RELATED APPLICATION

The application has related subject matter to that disclosed in the following co-pending, commonly assigned application: "METHOD FOR FORMING A PLUG AND SEMICONDUCTOR DEVICE HAVING THE SAME," by Maniar et al., Ser. No. 08/393,782 U.S. Pat. No. 5,534,462, filed Feb. 24, 1995.

FIELD OF THE INVENTION

The present invention relates to the manufacture of semiconductor devices in general and more particularly, to a method for forming vias in semiconductor devices.

BACKGROUND OF THE INVENTION

A continuing trend in semiconductor manufacturing is to make more powerful and highly integrated devices in a smaller area. Manufacturers achieve this objective by making individual feature sizes smaller and by locating these features closer together. In doing so, the alignment of one layer to another within the device becomes more critical.

In aligning and contacting metal layers to one another in a semiconductor device, a traditional method for alleviating the alignment problem has been to include landing pads incorporated into an underlying metal line to provide extra space for a via to be landed and contact the underlying metal line. A via is an opening formed in an interlayer dielectric designed to expose a certain portion of an underlying metal line to enable electrical contact to be made to the line. A conductive contact is then formed in the via to connect the underlying metal line with a subsequently deposited overlying metal line. The via and conductive contact thus serve to vertically connect the underlying metal line to the overlying metal line. While ideally the via opening is made as small as possible in order to further the goal of reducing total device size, in practice the via must have a certain minimal width. This minimal width is dictated both by the process used to etch the opening in the interlayer dielectric and by the contact resistance between the underlying metal line and the conductive contact material that fills the via opening. The larger the via opening, the larger the contact area between the conductive contact material and the metal line, and therefore the lower the contact resistance.

Due to these lower limit restraints on the via diameter, the via typically is designed to have a width which is the same size or only slightly smaller than the width of the underlying metal line which is to be contacted. When two features have practically the same size, it is difficult to precisely align these features to one another. Landing pads can be incorporated into the line where the via is to contact the line. A landing pad is simply an expansion of the metal line in the general via area. The landing pad provides a sufficient misalignment tolerance wherein the via is practically assured of falling completely within the landing pad area, and therefore being bottomed entirely on the underlying metal.

With the trend of smaller devices, the use of landing pads is disfavored for the landing pads inhibit closer spacing of adjacent metal lines. Therefore, semiconductor manufacturers are beginning to again use unlanded vias. But in using unlanded via (where the metal line width is the same where the via is to contact as elsewhere along the metal line) and in the instance where the via width is the same size or only slightly smaller than the width of the metal line, any misalignment will cause the via to be bottomed only partially on the metal line and partially in the interlayer dielectric. An example of what this misalignment looks like from a cross-sectional prospective is illustrated in FIG. 1.

Illustrated in FIG. 1 is a portion of a semiconductor device 10. Device 10 includes a semiconductor substrate 12 having an overlying metal line 14. Substrate 12 would typically be a single crystal semiconductor wafer, having a variety of pre-metal layers deposited or formed thereon. For example, substrate 12 can be a silicon wafer, having one or more polysilicon layers, field isolation oxides, gate oxides, silicon nitride layers, and the like. These and other pre-metal layers are compositely represented in FIG. 1 simply as substrate 12. Metal line 14 is most typically formed of aluminum, which may be alloyed with small amounts of silicon and/or copper. In many instances, the metal line will also include a capping layer 16 which can serve multiple purposes. One such purpose is as an anti-reflective coating (ARC) to aid the photolithography and etching of the metal line. Another purpose may be to serve as an etch stop or barrier material to protect metal line 14 during a subsequent via etch.

After metal line 14 is defined on substrate 12, an interlayer dielectric 18 is deposited over device 10 and is patterned and etched to form an opening or via 20, as illustrated in FIG. 1. As shown, it is apparent that via 20 is not perfectly aligned to underlying metal line 14. A portion of via 20 is bottomed on the metal line, yet a small portion is bottomed in interlayer dielectric 18. The portion of via 20 bottomed within the interlayer dielectric is actually deeper than remaining portions of the via. This is due to the need to over etch vias to account for variations in the thickness of interlayer dielectric 18 across the entire substrate surface. Metal line 14, and perhaps capping layer 16, arrest the via etch over the line, but the etch continues to attack the interlayer dielectric beyond the metal line, creating a small trench 22.

Trench 22 poses a variety of problems. One problem is that trench 22 often extends deep enough to expose a conductive member beneath metal line 14, such that upon depositing a conductive material within via 20, metal line 14 is shorted to the underlying conductive member. Another problem with the creation of trench 22 is that a sidewall portion 24 of metal line 14 becomes exposed during via etch. On the one hand, exposure of sidewall portion 24 is advantageous in that upon depositing a conductive material in via 20, the contact area between the conductive material filling via 20 and metal line 14 is increased, thereby lowering the contact resistance. However, a problem exists in exposing sidewall portion 24 to certain gases, particularly to metal source gases used to deposit the conductive material within via 20, and more particularly to tungsten hexafluoride ($WF_6$). Tungsten is a commonly used plug material used to fill via 20 and vertically connect metal line 14 with a subsequently formed overlying metal line. Tungsten is typically deposited by chemical vapor deposition using a gaseous tungsten source of tungsten hexafluoride. However, aluminum is very reactive with tungsten hexafluoride. Upon exposure to the gas, the aluminum forms an aluminum fluoride compound which significantly degrades contact reliability.

In some tungsten plug processes, tungsten is not the first metal which is deposited into via 20. Instead, one or more barrier layers or glue layers are deposited to line the via prior to tungsten deposition. While in some instances these layers may serve to shield the top of metal line 14 from exposure to tungsten source gases, it is very difficult for these layers to adequately be deposited within trench 22 because the glue layers cannot be conformally deposited in the trench because the trench is very narrow and is formed deep within via 20. Therefore, use of barrier layers or glue layers is not an adequate means to protect against all unwanted reactions between metal line 14 and subsequently used metal source gases.

From the forgoing it is apparent that an improved method for forming vias in a semiconductor device is needed. More particularly, it is desirable that an improved process enable the formation of vias between metal layers to occur without the detrimental effect of exposing metal members to reactive gases during the fabrication process.

DETAILED DESCRIPTION OF A PREFERRED EMBODIMENT

Figure 1:
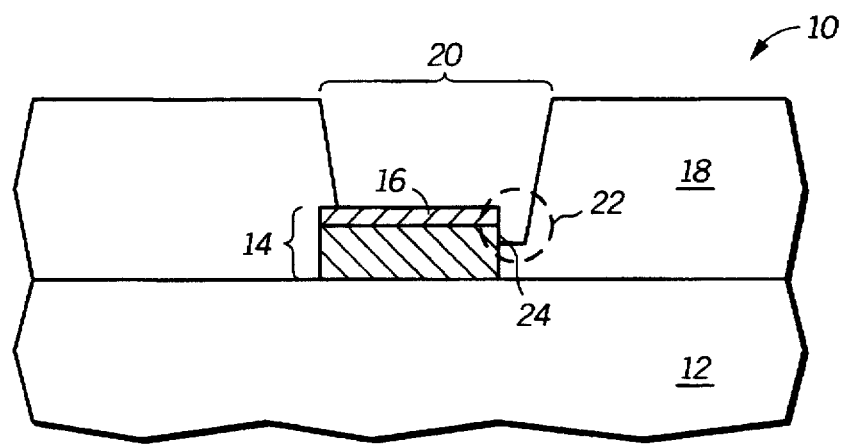
FIG. 1 is a cross-sectional illustration of a via formed in a semiconductor device in accordance with the prior art.

Generally, the present invention provides a method for forming a via in a semiconductor device which prevents exposure of a sidewall of a conductive interconnect or metal line to which the via is formed. The sidewall is protected by depositing a blanket dielectric nitride layer over the conductive interconnect prior to deposition of an interlayer dielectric, such that upon formation of a via in the interlayer dielectric, the nitride layer serves as an etch stop and prevents exposure of the metal sidewall. The nitride layer exposed within the via is then anisotropicly etched to expose the top of the conductive interconnect to enable electrical contact to be made. However, the sidewall of the conductive interconnect remains protected by the nitride layer due to the anisotropic nature of the nitride etch. Tungsten or another conductive material can then be used to fill a via without fear that the gaseous source used to form the conductive via-fill material will undesirably react with the conductive interconnect. Accordingly, in practicing the present invention, unlanded vias can be formed in a semiconductor device without concern for exposing the sidewall of the conductive interconnect reactive metal source gases, thereby improving contact reliability and via resistance.

These and other features of the present invention will become more clearly understood from the following detailed description taken in conjunction with the accompanying drawings. It is important to point out that the illustrations are not necessarily drawn to scale and that there are likely to be other embodiments of the present invention which are not specifically illustrated. Like reference numerals are sometimes used throughout the several figures to designate identical or corresponding parts.

Figure 2:
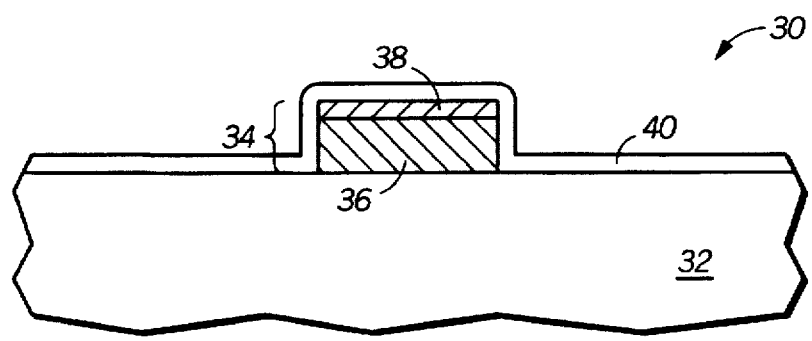
FIGS. 2–6 illustrate in cross-section a process for forming a via in a semiconductor device in accordance with the present invention.

FIGS. 2–6 illustrate in cross-section a series of sequential processing steps used to form a via in accordance with one embodiment of the present invention. Shown in FIG. 2 is a portion of a semiconductor device 30 which serves as an appropriate starting point for describing the present invention. Device 30 includes a semiconductor substrate 32 having an overlying conductive interconnect 34. The present invention can be fully understood in the context of one interconnect and one via, so for the sake of clarity only one interconnect and one via are illustrated and described. However, one familiar with semiconductor devices will appreciate that a plurality of interconnects and vias will occur throughout the device and at multiple levels within a device. In one form, conductive interconnect 34 includes a base metal portion 36 and a capping layer 38 formed on the top surface of the base metal portion 36. In a preferred embodiment of the present invention, base metal portion 36 is formed of aluminum, which can be alloyed with silicon and/or copper. The present invention can, however, be practiced with interconnects of other types of metals whose exposure during via etch poses similar contact reliability problems. Capping layer 38 is preferably a titanium nitride layer to act as an anti-reflective coating during patterning of the base metal portion. It is noted that capping layer 38 is an optional part of the interconnect structure, as it serves no needed function during the subsequent via etch process. Conductive interconnect 34 is formed in accordance with conventional processing. For example, a blanket layer of aluminum or an aluminum alloy is sputter deposited across device 30 followed by a blanket layer sputter deposition of titanium nitride. The blanket layers are then patterned and etched simultaneously to create the metal-cap stack illustrated in FIG. 2.

Conductive interconnect 34 is formed overlying semiconductor substrate 32. Although illustrated as one element, substrate 32 is actually likely to include multiple layers which are formed on a single crystal semiconductor wafer. For example, the base wafer can be a silicon or gallium arsenide wafer on which various dielectric and conductive members have been grown or deposited. For example, the wafer can include one or more polysilicon layers, silicide layers, doped or undoped silicon dioxide layers, implanted or diffusion regions, nitride layers, sidewall spacers, or other materials typically used in forming individual semiconductor devices such as transistors, resistors, and the like. For simplicity, these various layers are compositely illustrated as a single layer, namely semiconductor substrate 32. For the purposes of understanding and practicing the present invention, this specific configuration of the underlying layers is not important, and therefore will not be described or illustrated further.

After conductive interconnect 34 has been defined, a blanket etch stop layer 40 is deposited across semiconductor device 30. In preferred embodiments, etch stop layer 40 is a dielectric nitride layer, for example silicon nitride or aluminum nitride, which is deposited to a thickness of approximately 500 angstroms (Å) or 50 nanometers (nm). Although, thicknesses falling within the range of about 200–700Å are likewise suitable. Conventional processes for depositing a nitride layer can be followed in practicing the invention. For example, in depositing a silicon nitride layer, conventional CVD using silane and an ammonia or nitrogen source gas is suitable. A plasma-enhanced CVD (PECVD) method is preferred due to its compatibility with low temperature post-metal processing. If depositing an aluminum nitride layer, the layer can be formed by reactive sputtering (RS) with an aluminum target in a nitrogen atmosphere. While dielectric nitrides are a preferred material for etch stop layer 40, the layer's most important characteristic is that it can serve as an etch stop in etching a subsequently deposited interlayer dielectric (as explained below).

Figure 3:
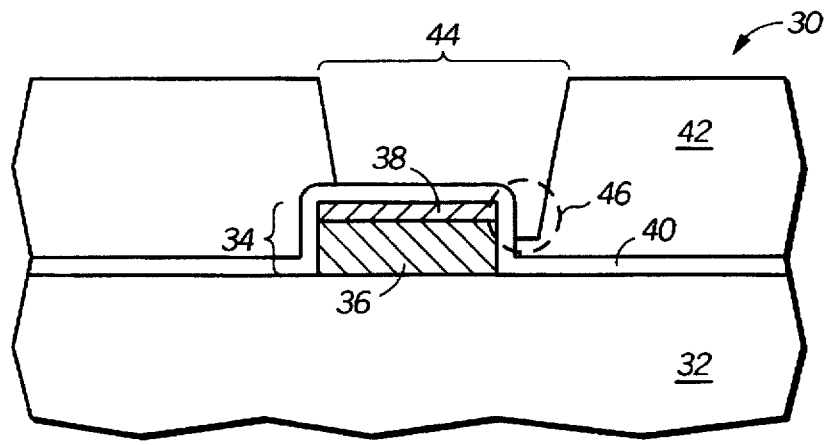

After etch stop layer 40 has been deposited, an interlayer dielectric 42 is deposited across device 30, as illustrated in FIG. 3. Interlayer dielectric 42 is preferably a silicon dioxide based material which can be in the form of phosphorus doped silicate glass (PSG), boron-doped PSG (BPSG), tetra-ethyl-ortho-silicate (TEOS), or the like. Other low temperature dielectrics may also be suitable as interlayer dielectric 42, including certain polyimides. Again, conventional deposition techniques can be used to form interlayer dielectric 42. Preferably, interlayer dielectric 42 is planarized after deposition, for example using a conventional etch-back or chemical mechanical polishing (CMP) operation.

After the interlayer dielectric is deposited, device 30 is patterned and etched to form an opening or via 44 in the interlayer dielectric, as also illustrated in FIG. 3. Patterning is accomplished using conventional photolithographic techniques, wherein photoresist is deposited over the entire device and is selectively exposed and developed to radiation to create a resist mask. The resist mask then serves to protect portions of interlayer dielectric 42 which are not to be etched. The masked device then undergoes a via etch to remove portions of interlayer dielectric 42 which are unmasked, such as the portion represented in FIG. 3 by via 44. The via etch is continued until all of the interlayer dielectric is removed from above the conductive interconnect within the via area. Due to differential interlayer dielectric thicknesses which typically occur across the device, certain vias may be exposed to the via etch for a prolonged period of time, such that an over-etch occurs. If the via is slightly misaligned, the over-etch will result in formation of a trench 46 along the side of the conductive interconnect. However, the via etch is performed selectively to etch stop layer 40, such that any over-etch which occurs does not expose any portion of conductive interconnect 34. Instead, the via etch only exposes portions of the etch stop layer 40 within via 44. As illustrated in FIG. 3, a small trench 46 may nonetheless be formed if via 44 is misaligned respective to the conductive interconnect 34. In other words, the presence of etch stop layer 40 does not eliminate the occurrence of trenching, rather it anticipates the occurrence of localized trenching and protects conductive interconnect 34 accordingly.

To achieve the selectivity of the via etch as depicted in FIG. 3, an etch chemistry is used which etches oxide much faster than etch stop layer 40, which is preferably in the form of a dielectric nitride. If etch stop layer 40 is a silicon nitride layer, a suitable etch chemistry used to form via 44 while stopping on etch stop layer 40 is a dry chemistry using $C_2F_6$ and argon or $C_3F_8$ and argon (either with or without CO). The same etch chemistry can be used to stop on an aluminum nitride etch stop layer.

Figure 4:
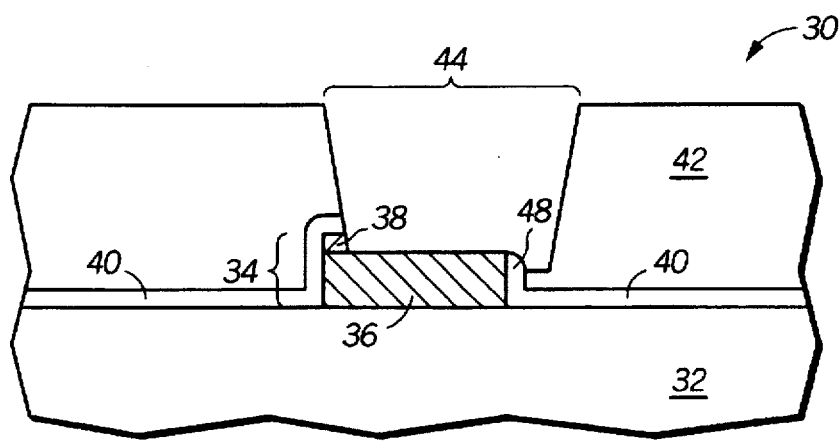

In order to make contact to conductive interconnect 34, portions of the etch stop layer 40 within via 44 must also be removed. However, care must be taken during the removal of etch stop layer 40 to ensure that certain portions of the sidewall of the conductive interconnect do not become exposed. This is particularly true with respect to base metal portion 36, which in a preferred embodiment is formed of aluminum. One method to insure that the sidewall of the base metal portion 36 does not become exposed is to remove the etch stop layer 40 anisotropically using a dry etch. As illustrated in FIG. 4, an anisotropic etch removes portion of etch stop layer 40 on top of conductive interconnect 34, while only recessing portions of etch stop layer 40 along the sidewall of the conductive interconnect, resulting in the formation of a sidewall portion 48 of the etch stop layer. As shown in FIG. 4, sidewall portion 48 protects the sidewall of base metal portion 36 from becoming exposed. FIG. 4 also illustrates that during the anisotropic etch of etch stop layer 40, any capping layer that may be present in the interconnect can also be removed. For reasons to be explained below, removal of the capping layer is not detrimental, despite the fact that such removal causes the top surface of base metal portion 36 to become exposed.

To save in manufacturing time, the etching of interlayer dielectric 42 and etch stop layer 40 can be accomplished in-situ in the same etch chamber, changing the etch chemistry and processing conditions as appropriate for each of the two different layers. For example, an Omega etch system by Applied Materials can be used to etch an oxide interlayer dielectric 42 using a $C_2F_6$ and argon chemistry selective to an underlying silicon nitride or aluminum nitride layer. After the interlayer dielectric is completely removed from within the vias, the etch chemistry can be changed to anisotropicly etch the nitride layer. Specifically, a combination of $CF_4$ and oxygen is used to anisotropicly etch portions of etch stop layer 40 exposed within via 44, whether the etch stop layer is formed of silicon nitride or aluminum nitride. The oxygen and fluorine within the chamber during the nitride layer etch may also remove portions of a titanium nitride capping layer 38 if present and if exposure time is sufficient. However, removal of any capping layer on the top surface of the interconnect by this etch does not pose a problem for reasons explained below.

Because the deposition thickness of etch stop layer 40 can be well controlled across the entire device surface, it will not be necessary to perform a substantial over-etch of etch stop layer 40 within via 44. Thus, the ability to remove the etch stop layer 40 from on top of the conductive interconnect, while protecting the sidewall of base metal portion 36 can be achieved uniformly across the device. Any over-etching which is necessary to clear the via is performed during the via etch used to etch interlayer dielectric 42.

Figure 5:
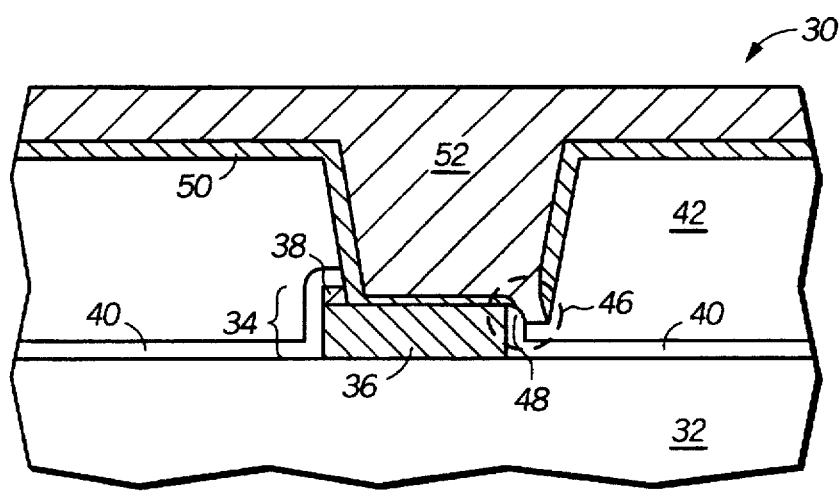
Figure 6:
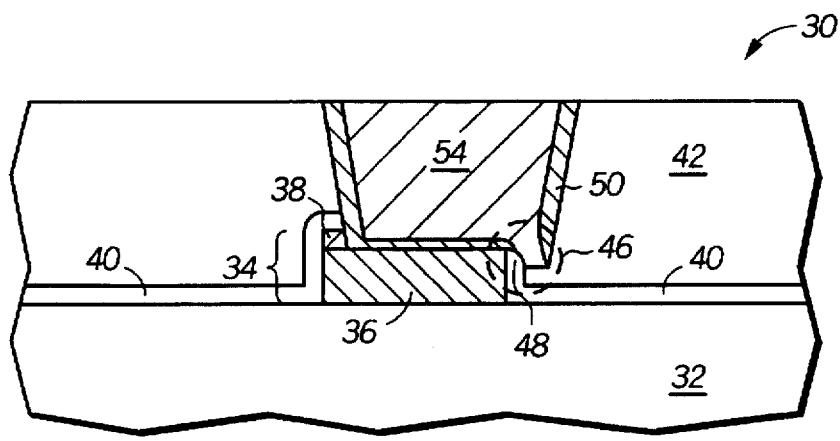

After the etch stop layer has been cleared within via 44 without exposing the sidewall of base metal portion 36, conventional contact or plug formation processes used to fill via 44 are performed, as illustrated in FIGS. 5 and 6. For example, to form a tungsten plug within via 44, one or more thin barrier layers or glue layers 50 can be conformably deposited across device 30, followed by a thick blanket deposition of a layer of tungsten 52. In a preferred embodiment, formation of barrier layers or glue layers 50 involve a sequential sputter deposition of titanium and titanium nitride deposited to a combined thickness of anywhere between 800–1500Å (80–150 nm). It is noted that the thicknesses given are the thickness of the barrier or glue layers as measured on the top of interlayer dielectric 42, since deposition on the materials is typically non-uniform. As FIG. 5 indicates, the barrier or glue layers 50 do not perfectly conform to the underlying topography. Typically the layers will be much thinner on the bottom of the via than on the top of the interlayer dielectric, and thinning can also occur near bottom corners.

The layer of tungsten 52 is then sputter deposited to a thickness sufficient to fill via 44, typically to a thickness of between 5000–10000Å (500–1000 nm). Preferably the tungsten is deposited by CVD using a tungsten source gas of tungsten hexafluoride ($WF_6$). As discussed previously, use of some tungsten source gases, $WF_6$ in particular, result in the undesirable formation of an aluminum fluoride compound if aluminum is exposed to the tungsten source gas. The present invention avoids such a result by insuring that any aluminum of the conductive interconnect is protected or capped during tungsten deposition. Sidewall portion 48 of etch stop layer 40 protects the sidewall of conductive interconnect, while barrier or glue layers 50 protect the top surface of the conductive interconnect. Because the barrier or glue layers are being used to shield the top of the conductive interconnect, the fact that capping layer 38 may be removed during the anisotropic etch of etch stop layer 40 is inconsequential.

In blanket depositions, the barrier or glue layers and the tungsten will also be deposited over interlayer dielectric 42 beyond via 44. This excess material must be removed to establish a electrical independence between the various vias that are formed. Removal of these portions of the conductive materials may be accomplished by known chemical mechanical polishing (CMP) or etch-back processes, as illustrated in FIG. 6. The result is a formation of a conductive plug 54 which contacts conductive interconnect 34. After plug formation, processing is continued in a conventional manner by depositing an additional metal interconnect layer or layers. The additional metal layer(s) is likewise patterned and etched to define individual conductive interconnects. Conductive plug 54 serves as a vertical connection between a conductive interconnect formed in the additional metal layer, and conductive interconnect 34.

In practicing the present invention, tungsten hexafluoride can be used to deposit a tungsten plug material, without concern that these tungsten source gases will undesirably react with aluminum contained in the interconnect. The presence of a blanket dielectric nitride layer over the conductive interconnect serves to shield the sidewalls from exposure during the via etch, and subsequently during deposition of the tungsten material. As a result, ensuring that the barrier or glue layers are adequately deposited in a localized via trench formed along the sidewall of the interconnect is not critical. Another advantage of the present invention is that because the nitride etch stop layer is a dielectric, the material need not be removed in portions of the semiconductor device other than within the via. Therefore an additional photolithography step, or an etch to form spacers, is not added into the manufacturing process in practicing the present invention. An further advantage is that an etch stop layer can be formed with the conventional materials, such as silicon nitride, thereby making implementation of the invention into an existing process very simple. Simplicity of manufacturing is furthered by the fact that interlayer dielectrics formed of oxide can readily be etched selectively to nitride materials using conventional etch chemistries.

Figure 7:
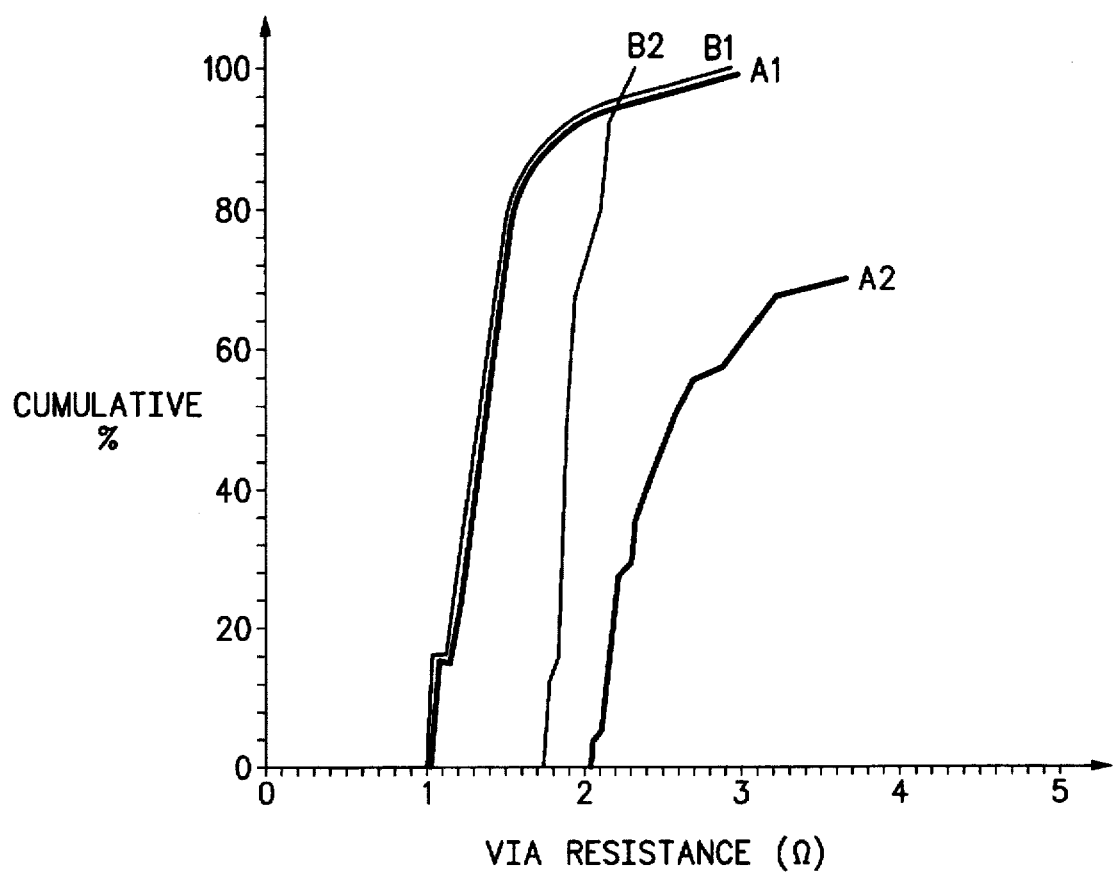
FIG. 7 illustrates in graphical form the improvement in via resistance in practicing the present invention as compared to conventional unlanded via resistance.

As a measure of the improvement which practicing the present invention has on contact reliability and via resistance, a series of experiments were conducted, the results of which are graphically illustrated in FIG. 7. Test wafers were fabricated with a series of via chains for the purpose of measuring the via resistance of contacts formed using a conventional unlanded via process (wafers of Set A) and contacts formed using an unlanded via process in accordance with the present invention (wafers of Set B). Both processes involved the formation of 0.9×0.9 vias to an aluminum interconnect having a titanium nitride anti-reflective capping layer. The vias were then filled by a titanium layer and a titanium nitride layer, which served as the barrier or glue layers. Tungsten was then deposited by CVD using a $WF_6$ source gas. CMP was then performed to remove excess tungsten, titanium nitride, and titanium. A second aluminum metallurgy was deposited, patterned, and etched to complete the via chains. The only processing difference between the two sets of wafers tested was that a blanket 500Å dielectric nitride etch stop layer was deposited just prior to deposition of the interlayer dielectric on the wafers in Set B, and further that this nitride etch stop layer was anisotropically etched as part of the via etch. (This etch also removed some or all of the titanium nitride anti-reflective capping layer on the interconnects). Silicon nitride was used as the etch stop layer in one-half of the wafers in Set B, while aluminum nitride was used as the etch stop layer in the other half. The test results from both halves were so similar that the data was combined and reported only as Set B in FIG. 7.

After fabrication of the test wafers, the via resistance of the wafers was measured, and is plotted in FIG. 7 for Sets A & B by lines A1 and B1, respectively. The X-axis of the graph is Via Resistance in ohms (Ω) while the Y-Axis is the Cumulative Percent of vias having a given via resistance or less. As is apparent, A1 and B1 have similar via resistance values. Accordingly, the addition and partial removal of an etch stop layer in a via in accordance with the present invention does not adversely affect the via resistance. To further test the reliability of vias, the wafers of both sets were baked and via resistance was again measured. The results of the post-baked tests are plotted in FIG. 7 for Sets A & B by lines A2 & B2, respectively. Upon baking, both sets of wafers showed an increase in via resistance. However, the increase in resistance is significantly disparate between the two sets of wafers. Set B, which uses a via etch stop in accordance with the present invention, showed an increase in via resistance of less than 0.5Ω, while the increase in resistance in the via in Set A was 1.0–2.0Ω. Thus, FIG. 7 illustrates the significant benefit one achieves in via reliability and contact resistance by incorporating an etch stop layer to protect the metal interconnect sidewalls during via etch.

Thus it is apparent that there has been provided in accordance with the invention, a method for forming vias in a semiconductor device that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. Therefore, it is intended that this invention encompass all such variations and modifications as fall within the scope of the appended claims

We claim:

1. A method for making a semiconductor device comprising the steps of:

providing a semiconductor substrate having a conductive interconnect, the conductive interconnect having a top surface and a sidewall;

depositing a blanket etch stop layer over the semiconductor substrate and adjacent the sidewall of the conductive interconnect;

depositing a dielectric layer on the blanket etch stop layer;

etching a via in the dielectric layer over the conductive interconnect using a dry etch chemistry, and stopping on the blanket etch stop layer to create an exposed portion of the blanket etch stop layer;

removing the exposed portion of the blanket etch stop layer within the via while maintaining a sidewall portion of the blanket etch stop layer adjacent the sidewall of the conductive interconnect; and filling the via with a conductive material using a gaseous source which includes fluorine to establish an electrical contact to the conductive interconnect without exposing the sidewall of the conductive interconnect to the gaseous source.

2. The method of claim 1 wherein the step of etching comprises etching a via over the conductive interconnect which overhangs the sidewall of the conductive interconnect and exposes the sidewall portion of the blanket etch stop layer.

3. The method of claim 1 wherein the step of providing a semiconductor substrate comprises providing a semiconductor substrate wherein the conductive interconnect is made at least in part of aluminum, and wherein the step of removing comprises removing the exposed portion of the blanket etch stop layer without exposing aluminum along the sidewall of the conductive interconnect.

4. The method of claim 3 wherein the step of filling comprises filling the via with tungsten using tungsten hexafluoride.

5. The method of claim 3 wherein the step of providing a semiconductor substrate comprises providing a semiconductor substrate wherein the top surface of the conductive interconnect has an overlying titanium nitride cap.

6. The method of claim 5 further comprising the step of removing the overlying titanium nitride cap prior to filling the via.

7. A method for making a semiconductor device comprising the steps of:

providing a semiconductor substrate having a conductive interconnect with a sidewall;

depositing a blanket dielectric nitride layer over the semiconductor substrate, over the conductive interconnect, and along the sidewall of the conductive interconnect;

depositing an oxide layer on the blanket dielectric nitride layer;

dry etching the oxide layer to form a via over the conductive interconnect, using the blanket dielectric nitride layer as an etch stop;

etching the blanket dielectric nitride layer to remove portions of the blanket dielectric nitride layer within the via, wherein etching the blanket dielectric nitride layer is performed anisotropically to maintain a portion of the blanket dielectric nitride layer along the sidewall of the conductive interconnect; and chemically vapor depositing a conductive material in the via using a source gas comprised of fluorine to make electrical contact to the conductive interconnect, wherein the portion of the blanket dielectric nitride layer along the sidewall of the conductive interconnect shields the conductive interconnect from exposure to fluorine from the source gas.

8. The method of claim 7 wherein the step of providing a semiconductor substrate comprises providing a semiconductor substrate wherein the conductive interconnect is comprised of aluminum.

9. The method of claim 8 wherein the step of depositing a blanket dielectric nitride layer comprises depositing an aluminum nitride layer.

10. The method of claim 8 wherein the step of depositing a blanket dielectric nitride layer comprises depositing a silicon nitride layer.

11. The method of claim 10 wherein the step of depositing a conductive material comprises depositing tungsten using a tungsten source gas.

12. A method for making a semiconductor device comprising the steps of:

providing a semiconductor substrate;

depositing a metal layer over the semiconductor substrate;

patterning and etching the metal layer to form a conductive interconnect having a base portion and a cap, the conductive interconnect also having a sidewall;

forming a dielectric nitride layer over the conductive interconnect and immediately adjacent the sidewall of the conductive interconnect;

forming a dielectric layer on the dielectric nitride layer;

dry etching a via in the dielectric layer, the via overlying a portion of the conductive interconnect and exposing a portion of the dielectric nitride layer, without exposing the conductive interconnect;

selectively removing the dielectric nitride layer exposed within the via while maintaining a portion of the dielectric nitride layer adjacent the sidewall of the conductive interconnect; and depositing a conductive material in the via using a source gas of the conductive material which includes fluorine, wherein during deposition, the sidewall of the conductive interconnect is protected from exposure to fluorine by the portion of dielectric nitride layer.

13. The method of claim 12 wherein the step of depositing a metal layer comprises depositing a metal layer comprising aluminum.

14. The method of claim 13 further comprising the step of forming a capping layer over the metal layer and as part of the metal interconnect.

15. The method of claim 14 further comprising the step of removing the capping layer within the via.

16. The method of claim 14 wherein the step of forming a dielectric nitride layer comprises forming a silicon nitride layer.

17. The method of claim 16 wherein the step of depositing a conductive material comprises depositing tungsten.

18. The method of claim 17 wherein the step of depositing a conductive material comprises depositing a barrier layer in the via prior to depositing tungsten, wherein the barrier layer covers a top surface of the conductive interconnect during deposition of tungsten, wherein the barrier layer protects the top surface of the conductive interconnect from exposure to fluorine during deposition of the conductive material.

19. The method of claim 16 wherein the step of depositing a conductive material comprises depositing tungsten by chemical vapor deposition using a gaseous source of tungsten hexafluoride.

20. The method of claim 12 wherein the step of depositing a dielectric layer is performed prior to any etching the dielectric nitride layer.

* * * * *